United States Patent
Narayanan et al.

(10) Patent No.: US 12,005,892 B2
(45) Date of Patent: Jun. 11, 2024

(54) SIMULATING DIVERSE LONG-TERM FUTURE TRAJECTORIES IN ROAD SCENES

(71) Applicant: NEC Laboratories America, Inc., Princeton, NJ (US)

(72) Inventors: Sriram Nochur Narayanan, San Jose, CA (US); Manmohan Chandraker, Santa Clara, CA (US)

(73) Assignee: NEC CORPORATION, Tokyo (JP)

( * ) Notice: Subject to any disclaimer, the term of this patent is extended or adjusted under 35 U.S.C. 154(b) by 819 days.

(21) Appl. No.: 17/090,399

(22) Filed: Nov. 5, 2020

(65) Prior Publication Data

US 2021/0148727 A1 May 20, 2021

Related U.S. Application Data

(60) Provisional application No. 62/935,326, filed on Nov. 14, 2019.

(51) Int. Cl.
*B60W 30/095* (2012.01)
*B60W 40/09* (2012.01)
(Continued)

(52) U.S. Cl.
CPC ......... *B60W 30/095* (2013.01); *G05D 1/0088* (2013.01); *G06F 30/27* (2020.01);
(Continued)

(58) Field of Classification Search
CPC ............... B60W 30/095; B60W 40/09; B60W 2556/10; G05D 1/0088; G05D 1/0221;
(Continued)

(56) References Cited

U.S. PATENT DOCUMENTS 8,948,995 B2 * 2/2015 Pandita ................ B60W 30/17
701/119
9,495,874 B1 * 11/2016 Zhu ................ B60W 60/00133
(Continued)

FOREIGN PATENT DOCUMENTS

WO     2018126083 A1     7/2018

OTHER PUBLICATIONS

Ma, Y., et al. "TrafficPredict: Trajectory Prediction for Heterogeneous Traffic-Agents" 33rd AAAI Conf. on Artificial Intelligence, pp. 6120-6127 (Jul. 2019) (Year: 2019).*

(Continued)

*Primary Examiner* — Jay Hann
(74) *Attorney, Agent, or Firm* — Joseph Kolodka

(57) ABSTRACT

A method for simultaneous multi-agent recurrent trajectory prediction is presented. The method includes reconstructing a topological layout of a scene from a dataset including real-world data, generating a road graph of the scene, the road graph capturing a hierarchical structure of interconnected lanes, incorporating vehicles from the scene on the generated road graph by utilizing tracklet information available in the dataset, assigning the vehicles to their closest lane identifications, and identifying diverse plausible behaviors for every vehicle in the scene. The method further includes sampling one behavior from the diverse plausible behaviors to select an associated velocity profile sampled from the real-world data of the dataset that resembles the sampled one behavior and feeding the road graph and the sampled velocity profile with a desired destination to a dynamics simulator to generate a plurality of simulated diverse trajectories output on a visualization device.

20 Claims, 8 Drawing Sheets

(51) Int. Cl.
    *G01C 21/00*     (2006.01)
    *G05D 1/00*     (2006.01)
    *G06F 30/27*     (2020.01)
    *G06V 20/56*     (2022.01)

(52) U.S. Cl.
    CPC ......... *B60W 40/09* (2013.01); *B60W 2556/10* (2020.02); *G01C 21/3815* (2020.08); *G06V 20/588* (2022.01)

(58) Field of Classification Search
    CPC ........ G05D 2201/0213; G01C 21/3815; G06F 30/27; G06V 10/82; G06V 20/58; G06V 40/20; G06V 20/588
    See application file for complete search history.

(56) References Cited

U.S. PATENT DOCUMENTS

| | | | | |
|---|---|---|---|---|
| 11,195,418 | B1* | 12/2021 | Hong | G08G 1/166 |
| 11,691,650 | B2* | 7/2023 | Li | B60W 60/00272 706/15 |
| 2021/0056863 | A1* | 2/2021 | Stefanescu | G06F 30/27 |

OTHER PUBLICATIONS

Bi, H., et al. "A Deep Learning-Based Framework for Intersectional Traffic Simulation and Editing" IEEE Transactions on Visualization & Computer Graphics, vol. 26, No. 7 (Jan. 2019) (Year: 2019).*

Morton, J., et al. "Analysis of Recurrent Neural Networks for Probabilistic Modeling of Driver Behavior" IEEE Transactions on Intelligent Transportation Systems, vol. 18, No. 5 (2017) (Year: 2017).*

Schulz, J., et al. "Interaction-Aware Probabilistic Behavior Prediction in Urban Environments" IEEE Int'l Conf. on Intelligent Robots & Systems, pp. 3999-4006 (2018) (Year: 2018).*

Cui, H., et al. "Multimodal Trajectory Predictions for Autonomous Driving using Deep Convolutional Networks" IEEE Int'l Conf. on Robotics & Automation, pp. 2090-2096 (May 2019) (Year: 2019).*

Nahmoon Lee et al., "Desire: Distant Future Prediction in Dynamic Scenes with Interacting Agents", arXiv: 1704.04394v1 (cs.CV) pp. 336-345, Apr. 14, 2017.

Chang et al., "Argoverse: 3D Tracking and Forecasting With Rich Maps", The IEEE Conference on Computer Vision and Pattern Recognition. Jun. 16-21, 2019. pp. 8748-8757.

Geiger et al., "Vision meets Robotics: The KITTI Dataset", International Journal of Robotics Research. vol. 32, No. 11. Sep. 2013. pp. 1-6.

Gupta et al., "Social GAN: Socially acceptable trajectories with generative adversarial networks", Proceedings of the IEEE Conference on Computer Vision and Pattern Recognition. Jun. 18-22, 2018. pp. 2255-2264.

Zhao et al., "Multi-Agent Tensor Fusion for Contextual Trajectory Prediction", The IEEE Conference on Computer Vision and Pattern Recognition. Jun. 16-20, 2019. pp. 12126-12134.

* cited by examiner

SIMULATING DIVERSE LONG-TERM FUTURE TRAJECTORIES IN ROAD SCENES

RELATED APPLICATION INFORMATION

This application claims priority to Provisional Application No. 62/935,326, filed on Nov. 14, 2019, the contents of which are incorporated herein by reference in their entirety.

BACKGROUND

Technical Field

The present invention relates to trajectory forecasting and, more particularly, to methods and systems for simulating diverse long-term future trajectories in road scenes.

Description of the Related Art

The ability to reason about the future states and intentions of agents in a scene is an important task for the autonomy of vehicles. Humans have the inherent ability to predict and reason about the various plausible actions in any given scenario. Nonetheless, humans still face a number of unpredictable daily events due to unforeseeable circumstances. For example, if an intersection scenario is assumed where the vehicles approach toward an intersection, there are multiple possible maneuvers that the vehicles can execute and similarly in a highway scenario where the vehicles can perform a lane change maneuver based on their intentions and current traffic situation. Having predictions biased towards a single direction of motion might not provide viable solutions in different cases. However, access to data with various driver intents is not something that existing datasets focus on. There have been targeted efforts in deep learning to obtain state-of-the-art results in trajectory forecasting, however, such efforts need large scale data. Obtaining such large-scale trajectory data is rare, especially for "interesting" cases that occur sporadically but are considered important in a forecasting perspective. A meaningful forecasting needs enough diversity in the data but in a real-world scenario, capturing such diversity in data for the same scene is not often plausible.

SUMMARY

A computer-implemented method for simultaneous multi-agent recurrent trajectory prediction is presented. The method includes reconstructing, via a scene generator, a topological layout of a scene from a dataset including real-world data, generating a road graph of the scene, the road graph capturing a hierarchical structure of interconnected lanes, incorporating vehicles from the scene on the generated road graph by utilizing tracklet information available in the dataset, assigning the vehicles to their closest lane identifications, identifying diverse plausible behaviors for every vehicle in the scene, sampling one behavior from the diverse plausible behaviors, by a diverse behavior generator, to select an associated velocity profile sampled from the real-world data of the dataset that resembles the sampled one behavior, and feeding the road graph and the sampled velocity profile with a desired destination to a dynamics simulator to generate a plurality of simulated diverse trajectories output on a visualization device to allow a user to select one or more of the plurality of simulated diverse trajectories for recreating a desired driving scenario.

A non-transitory computer-readable storage medium comprising a computer-readable program is presented for simultaneous multi-agent recurrent trajectory prediction, wherein the computer-readable program when executed on a computer causes the computer to perform the steps of reconstructing, via a scene generator, a topological layout of a scene from a dataset including real-world data, generating a road graph of the scene, the road graph capturing a hierarchical structure of interconnected lanes, incorporating vehicles from the scene on the generated road graph by utilizing tracklet information available in the dataset, assigning the vehicles to their closest lane identifications, identifying diverse plausible behaviors for every vehicle in the scene, sampling one behavior from the diverse plausible behaviors, by a diverse behavior generator, to select an associated velocity profile sampled from the real-world data of the dataset that resembles the sampled one behavior, and feeding the road graph and the sampled velocity profile with a desired destination to a dynamics simulator to generate a plurality of simulated diverse trajectories output on a visualization device to allow a user to select one or more of the plurality of simulated diverse trajectories for recreating a desired driving scenario.

A system for simultaneous multi-agent recurrent trajectory prediction is presented. The system includes a memory and one or more processors in communication with the memory configured to reconstruct, via a scene generator, a topological layout of a scene from a dataset including real-world data, generate a road graph of the scene, the road graph capturing a hierarchical structure of interconnected lanes, incorporate vehicles from the scene on the generated road graph by utilizing tracklet information available in the dataset, assign the vehicles to their closest lane identifications, identify diverse plausible behaviors for every vehicle in the scene, sample one behavior from the diverse plausible behaviors, by a diverse behavior generator, to select an associated velocity profile sampled from the real-world data of the dataset that resembles the sampled one behavior, and feed the road graph and the sampled velocity profile with a desired destination to a dynamics simulator to generate a plurality of simulated diverse trajectories output on a visualization device to allow a user to select one or more of the plurality of simulated diverse trajectories for recreating a desired driving scenario.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
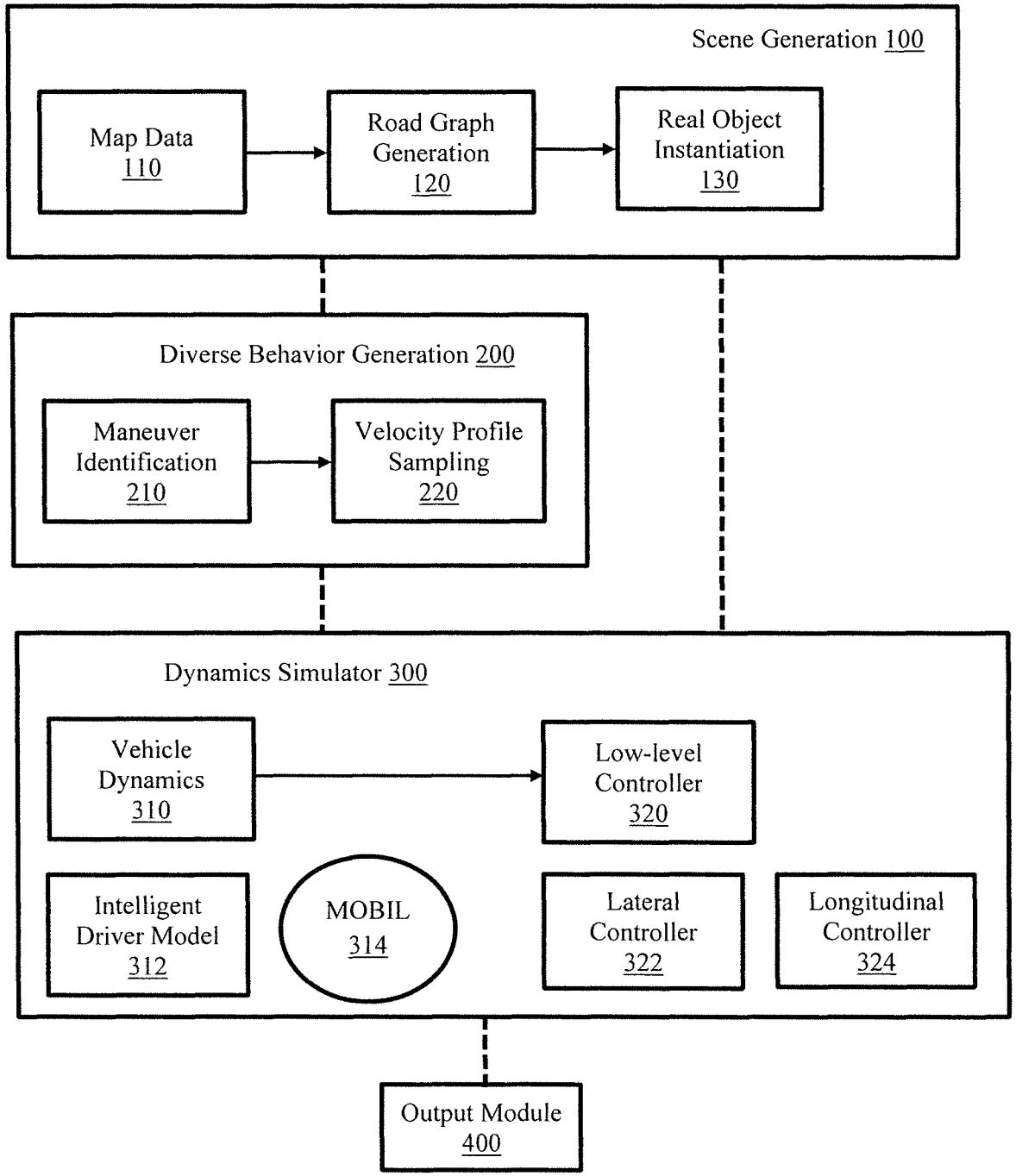
FIG. 1 is a block/flow diagram of an exemplary overall pipeline illustrating a behavior generation process for a single vehicle in a scene, in accordance with embodiments of the present invention.

The exemplary embodiments of the present invention introduce a generic forecasting data generation method with multiple behaviors for each vehicle in a scene. The exemplary embodiments emphasize simulating multiple behaviors to obtain various trajectories of interest in a given scenario. Such multi-behavioral trajectories for a scene can only be possible in a simulation environment. The exemplary embodiments simulate trajectories in Birds-Eye-View (BEV) instead of simulating in sensor space such as images or point-clouds. Simulating occurs in top-view abstracts away from low-level domain gaps due to appearances or sensor characteristics. The current trends also rely on high definition (HD) semantic maps for navigation of self-driving robots. The exemplary embodiments can leverage information available from, e.g., OpenStreetMaps (OSM), to simulate scenes for various datasets. OSM maps provide top view topological information of the road with centerlines and lane information. A simulation environment includes the challenge of modelling the scene structure and dynamics in accurate fashion to simultaneously obtain realism and diversity of the generated data. The exemplary embodiments tackle this issue by sampling velocity profiles from real-world trajectory information and use such sampled velocity profiles as a reference profile for the simulated vehicles in a scene.

The exemplary embodiments simulate such trajectories for existing datasets. As such, the exemplary embodiments obtain N number of trajectories for M scenes. The exemplary embodiments show improvements in forecasting results with baselines methods trained on the data and tested on existing real-world datasets. Qualitatively, the exemplary embodiments show that multi-modal trajectory prediction methods capture diversity much better by using the data compared to existing real-world datasets. To this end, the contributions are as follows:

The exemplary embodiments introduce a generic dataset generation method based on Birds-Eye-View (BEV) simulation of the scene for the existing datasets to generate diverse driver intents for a particular scenario. The exemplary embodiments illustrate improvements in baseline results on existing real-world datasets and also show that they capture diversity in a much better sense which is beneficial for autonomous driving scenarios. The exemplary embodiments further introduce a method for generating diverse trajectories based on simulation techniques with an appropriate amount of realism.

The exemplary solution includes:

A scene generation module that reconstructs the topological layout of the scene from real-world data. The reconstructed layout is further used to simulate vehicles from the real-world data.

A diverse behavior generation module that identifies plausible behaviors that can be executed in the current scene. The diverse behavior generation module then samples one behavior for each vehicle from a pool of identified behaviors. The exemplary embodiments introduce a mechanism to sample velocity profiles according to the behavior from real-world data based on heuristics such as distance to intersection and average velocity.

The exemplary embodiments introduce a dynamics simulator that simulates vehicle trajectories based on the sampled velocity profile of the vehicle (e.g., car) and its surroundings. This provides a set of simulated trajectories.

Here, the exemplary embodiments generate multiple behaviors for the vehicles using the same scene, thus obtaining diverse trajectories.

Unlike traditional methods which generate completely synthetic datasets using the simulator, the exemplary embodiments adapt scenes from the real-world data to simulate diverse behaviors with appropriate realism in the scene and executed velocities.

The exemplary embodiments introduce an algorithm to reconstruct top view representations from real-world data as road graphs and simulate vehicles in the real scene.

The exemplary embodiments identify diverse behaviors for every vehicle in the scene and sample one behavior. The exemplary embodiments select a velocity from the real-world data that closely resembles the selected behavior. The heuristics used for nearest neighbor sampling are distance to intersection and average velocity. This helps in identifying a closest behavior from real scenes.

The simulation pipeline in augmenting real-world data with diverse trajectories is a method employed to solve data issues for trajectory forecasting.

FIG. 1 illustrates the overall pipeline for the behavior generation process for a single vehicle in a scene, in accordance with an embodiment of the present invention.

Regarding the scene generation or generator 100, unlike other simulation mechanisms which completely rely on synthetic simulation, the exemplary embodiments reconstruct exact scenes from real-world data to use such real-world data for the purpose of simulation.

Regarding road graph generation or generator 120, the exemplary embodiments extract lane polylines from the real-world data 110 high-definition (HD) map or use openly available map information and generate a hierarchical road graph of interconnected lanes. Here, lane end points are identified by a unique identifier and represent a node in the graph.

Regarding real object instantiation 130, the exemplary embodiments utilize tracklet information available in the dataset to place vehicles in the generated road graph. The exemplary embodiments differ in a way that real scenes are reconstructed, and traffic scenes are utilized from the real-world data for simulation. A tracklet is a fragment of the track followed by a moving object, as constructed by an image recognition system.

Regarding real object instantiation 130, the exemplary embodiments recreate a specific driving scenario with the help of tracklet information provided by these datasets. The vehicle pose information is projected back on the local road graph in the ego frame of reference. The exemplary embodiments use the vehicles tracklet location and yaw information to calculate the nearest lane ID that it occupies. Each instantiated vehicle is assigned with a lane ID and is placed in the center of the lane with yaw angles matching heading of lanes at the respective lane locations. For simulation purposes, the exemplary embodiments only consider vehicles that are moving. These calculated assumptions make the scene generation process practically viable.

Regarding diverse behavior generation or generator 200, instead of selecting random goal points, the exemplary embodiments first identify diverse plausible behaviors for every vehicle in the scene and sample one behavior. Also, unlike other simulation techniques where vehicles move at constant velocity or with some predefined velocity, the exemplary embodiments select a velocity profile from the real-world data that closely resembles the selected behavior. The behavior generation or generator 200 includes maneuver identification 210 and velocity profile sampling 220.

Regarding maneuver identification 210, 210 identifies different maneuvers that can be executed by vehicles in the scene and samples one maneuver for every vehicle.

Regarding velocity profile sampling 220, 220 samples a velocity profile for the selected behavior from the real-world data. The heuristics used for nearest neighbor sampling are distance to intersection and average velocity. This helps in identifying a closest behavior from real scenes.

Regarding velocity profile sampling 220, in order to obtain realistic simulation trajectories, the exemplary embodiments first create a pool of real-world trajectory samples. Firstly, the exemplary embodiments perform the scene generation process and associate each real-world trajectory with a set of lane centerlines from the local road graph, that was used during the course of the trajectory. This centerline information helps in classifying the real-world trajectories into different maneuver categories and in obtaining other higher-level trajectory characteristics like distance travelled before turning for turn maneuvers. The exemplary embodiments store this information prior to simulation for sampling reference velocity profiles from real-world trajectories. At simulation time, after sampling a desired behavior, the exemplary embodiments obtain a Nearest Neighbor velocity profile for the current scene based on features such as distance before turn or average velocity for turn and straight maneuvers, respectively.

The system illustrated in FIG. 1 can be employed in Advanced Driver Assistance Systems (ADAS), robotics, and other applications that require knowledge of how other vehicles/agents move in the scene. The system of FIG. 1 can be used to simulate diverse behaviors for humans or vehicles and plan safest actions accordingly. Alternatively, the system can also be used to generate diverse training examples for training models employed in ADAS and other applications that require autonomy to navigate in social places.

The simulation engine includes several components, that is, scene generation module 100, behavior generation module 200, and a dynamics simulation engine or dynamics simulator 300. Given a dataset to recreate and simulate, the scene generation module 100 takes lane centerline information that can be either acquired through openly available map information or provided by the dataset 110. The exemplary embodiments utilize this information to create a graph data structure that includes nodes and edges representing end points of the lane and lane centerline, respectively. This, when rendered, provides a BEV reconstruction of the local scene. This is referred to as a road graph. The object instantiation module 130 uses the tracklet's information from the dataset 110 to project them onto the generated road graph. The exemplary embodiments do so by defining a coordinate system with respect to the ego vehicle and find the nearest edge occupied by the objects in the graph.

Now, for every vehicle that was instantiated in the scene, the exemplary embodiments find various possible maneuvers that can be executed given the traffic conditions and road structure from which, the exemplary embodiments uniformly sample different vehicle behaviors for the simulation. The exemplary embodiments refer to "behaviors" as vehicles executing different maneuvers like {straight, left turn, right turn, and lane changes}. To execute such diverse behaviors that are significantly realistic, the exemplary embodiments sample appropriate velocity profiles from real-world datasets as references that closely resemble the intended behavior that the vehicle is planning to execute. The dynamics simulation module utilizes this reference velocity to execute the right behavior for every vehicle but at the same time considers the scene layout and the current traffic conditions to provide a safe acceleration that can be executed.

The exemplary embodiments simulate every scene for, e.g., 7 seconds and generate a maximum of, e.g., 3 diverse behaviors. The simulation is performed at, e.g., 10 Hz and output from the simulation includes vehicle states $\{x, v, \psi, a, \phi\}_1^T$ which represent position, velocity, heading, acceleration, and steering over the course of the simulation. the exemplary embodiments will now provide a brief description of each component.

Regarding scene generation 100, the exemplary embodiments utilize the lane information from, e.g., OpenStreetMaps (OSM) or from datasets 110 for creating the road graph. For such purposes, the exemplary embodiments make use of the road information such as centerline, number of lanes and one-way information for each road segment. Every bi-directional road centerline is split based on the specified number of lanes and one-way information. The vehicle pose information from the dataset 110 is used to recreate exact driving scenarios.

Regarding diverse behavior generation 200, given a particular lane ID (node) on the local road graph for every vehicle, the exemplary embodiments first explore K possible leaf nodes that can be reached within a threshold distance. The exemplary embodiments categorize plausible maneuvers from any given node into three different categories {left, right, straight}. Prior to the simulation, the exemplary embodiments create a pool of reference velocity profiles from the real-world data. At simulation time, after sampling a desired behavior, the exemplary embodiments obtain a Nearest Neighbor velocity profile for the current scene based on features such as distance before turn and average velocity, for turn and straight maneuvers, respectively.

Regarding dynamics simulation 310, the dynamics module 300 utilizes the road graph, a behavior from a pool of diverse plausible ones and a reference velocity that needs to be tracked for the appropriate behavior. The dynamics engine 300 is governed by an Intelligent Driver Model (IDM) 312 and MOBIL 314 (minimizing overall braking by induced lane changes). Acceleration and lane change decisions obtained from this dynamics module 300 is fed to a low-level controller 320 that attempts to track and exhibit appropriate state changes in the vehicle behavior (both lateral controller 322 and longitudinal controller 324). The predicted trajectories are output by output module 400. In order to limit the acceleration under safety limit for the any traffic situation and to incorporate interactions among different agents in the scene the exemplary embodiments use an IDM behavior for the simulated vehicles. The input to an IDM includes distance to the leading vehicle s, the actual velocity of the vehicle v, the velocity difference with the leading vehicle Δv and provides an output $a_{IDM}$ that is considered safe for the given traffic conditions.

It is given by the equation:

$$a_{IDM}(s, v, \Delta v) = a\left(1 - \left(\frac{v}{v_o}\right)^\delta - \left(\frac{s^*(v, \Delta v)}{s}\right)^2\right),$$

where, a is a comfortable acceleration and vo is a desired reference velocity. δ is an exponent that influences how acceleration decreases with velocity. The deceleration of the vehicle depends on the ratio of desired minimum gap s* to actual bumper distance s with the leading vehicle.

s* is given by equation:

$$s^*(v, \Delta v) = s_o + vT + \frac{v\Delta v}{2\sqrt{ab}}$$

where, so is the desired safety distance to maintain, T is the safety time gap of the vehicle and b is the comfortable desired deceleration of the vehicle. $\{s_o, a, T, b, \delta\}$ are hyper-parameters that generate various vehicle behaviors. The exemplary embodiments sample these parameters during simulation time to generate simulations with different levels of aggressiveness.

Regarding lane change decisions, the exemplary embodiments also consider lane changing behavior to add additional diversity in vehicle trajectories apart from turn based maneuver trajectories. Lane changing behaviors are modeled based on the MOBIL algorithm.

The following are the parameters that control lane changing behavior: politeness factor p that influences lane changing if there's acceleration gain for other agents, lane changing acceleration threshold $\Delta a_{th}$, maximum safe deceleration $b_{safe}$ and bias for particular lane $\Delta a_{bias}$.

The following equations govern whether a lane change can be executed, $$\tilde{a}_c - a_c + p\{(\tilde{a}_n - a_n) + (\tilde{a}_o - a_o)\} > \Delta a_{th} - \Delta a_{bias},$$

$$(\tilde{a}_n - a_n) > -b_{safe}^n, (\tilde{a}_c - a_c) > -b_{safe}^c.$$

Here, a is a current acceleration and ã represents a new acceleration after lane change. c, n, o subscripts denote current, new vehicle, and old vehicles, respectively.

A lane change maneuver is only executed when there is sufficient acceleration gain or the braking imposed for the current or the following vehicles after lane change is greater than a safe threshold as represented by the equation.

Low-level controller 320 simulates the behavior characteristics governed by the vehicle dynamics module 300. Low-level controller 320 takes input from maneuver identification, IDM (312), and MOBIL (314) modules and produces state changes for the simulated vehicle. Low-level controller 320 includes longitudinal and a lateral proportional controllers 322, 324 that give out respective velocity commands. The lane centerline obtained during the maneuver identification process is used as a reference trajectory for the simulated vehicle. The velocity obtained from the lateral controller 322 is converted to appropriate steering commands that helps in tracking the reference trajectory. Let v be the current velocity of the vehicle, $x_{lateral}$ be the lateral position from the lane and $v_{lateral}$ be the lateral velocity then steering angle φ is obtained through the following equations:

$$v_{lateral} = -kp_{lateral} * (x_{lateral} + \epsilon)$$

$$\psi_{req} = \arcsin\left(\frac{v_{lateral}}{v}\right)$$

$$\psi_{ref} = \psi_{future} + \psi_{req}$$

$$\dot{\psi} = kp_{heading} * \psi_{ref}$$

$$\phi = \arctan\left(\frac{L}{v}\dot{\psi}\right)$$

Here, $kp_{lateral}$ and $kp_{heading}$ are controller parameters, L represents length of the vehicle and $\epsilon$ acts as an offset noise in tracking the lane. $\psi_{reg}$ is the heading that needs to be compensated for aligning with the lane center, while $\psi_{future}$ is the required heading that needs to be achieved for future timesteps. A heading controller provides a heading rate $\dot{\psi}$ for the given reference heading $\psi_{ref}$.

Now, a single representation model is introduced for predicting trajectories for multiple agents in a road scene such that the predictions are context aware, multimodal and have constant inference time irrespective of number of agents. The exemplary embodiments formulate the trajectory prediction issue as per frame regression of agents' locations over the spatial grid.

Given the lane centerline information $L^{1 \cdots m}$ for a scene, the exemplary embodiments render them in top view representations such that the scene context map $\mathcal{I}$ is of H×W×3 where channel dimension represents one-hot information of each pixel corresponding to road, lane, and unknown road element.

Let $X_i = \{X_i^1, X_i^2, \ldots, X_i^t\}$ denote trajectory information of $i^{th}$ vehicle from timestep $1 \ldots T$ where each $X_i^t = (x_i, y_i)^t$ represents spatial location of the agent in the scene. The network takes input in the form of relative coordinates $^RX_i$ with respect to agent's starting location.

For the $i^{th}$ agent in the scene, the exemplary embodiments project $^RX_i$ at corresponding Xi locations to construct a spatial location map of states $S^{1 \cdots T}$ such that $S^t[X_i^t]$ includes relative coordinate of $i^{th}$ agent at timestep t. $^RY_i = ^RX_i^{t_{obs} \cdots T}$ represents ground truth trajectory. And the exemplary embodiments further denote $\mathcal{M}^t$ as the location mask representing configuration of agents in the scene. To keep track of vehicles across timesteps, the exemplary embodiments construct a vehicle IDs map $\mathcal{V}^{1 \cdots T}$ where $\mathcal{V}^t[X_i^t] = i$.

Furthermore, the exemplary embodiments associate each trajectory $X_i^{t_{obs} \cdots T}$ with a label ci that represents the behavioral type of the trajectory from one of {straight, left, right} behaviors. And trajectory label for lane changes falls in one of the three categories.

Let $\mathcal{C}$ encode grid map representation of ci such that $\mathcal{C}^t[X_i^t] = c_i$. Note that vehicle trajectories are not random compared to the human motion. Instead, they depend on behaviors of other vehicles in the road, which motivates us to classify trajectories based on different maneuvers.

The exemplary embodiments follow a formulation where the network takes previous states $S^{1 \cdots t_{obs}}$ as input along with the scene context map I, trajectory label map $\mathcal{C}$, location mask M and a noise map $\mathcal{Z}$ to predict the future trajectories $^R\hat{Y}_i$ for every agent at its corresponding grid map location $X_i^t$ in the scene. Note that the exemplary embodiments do not have a separate head for each agent. Instead, the network predicts a single future state map $\hat{S}^t$ where each individual agent tries to match $^R Y_i^t$ at t.

Figure 4:
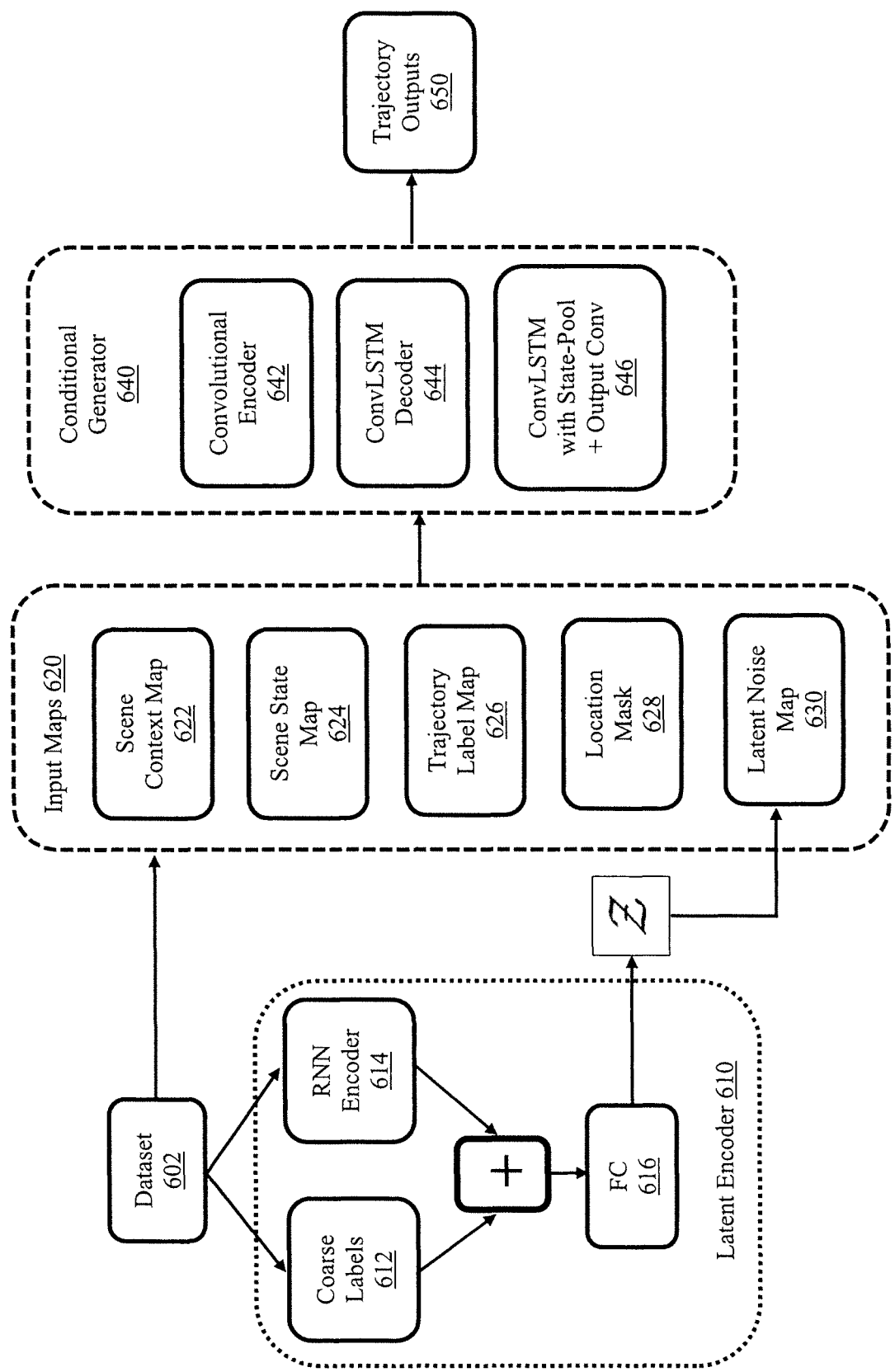
FIG. 4 is a block/flow diagram of the exemplary overall architecture for the simultaneous multi-agent recurrent trajectory (SMART) framework, in accordance with embodiments of the present invention.

The exemplary embodiments illustrate the pipeline in FIG. 4. The network architecture includes a latent encoder 610 and a conditional generator 640. The exemplary embodiments model the temporal information with the agents' previous locations using convolutional Long-Short-Term Memories (ConvLSTMs). The exemplary embodiments further introduce a state pooling operation to feed agents state information at respective locations in consecutive timestep. While the exemplary embodiments provide trajectory specific labels to capture diverse predictions, the exemplary embodiments leverage conditional variational generative models to model diversity in the data for each type of label.

Regarding the latent encoder 610, 610 acts as a recognition module $Q_\phi$ for the framework and is only used during the training phase. Specifically, the latent encoder 610 takes in both the past and future trajectory information $^R X_i$ (602) and passes them through RNN encoder 614. The embedded vectors are then passed on through an LSTM network in 614 to produce encodings at every timestep. The outputs across all the timesteps are concatenated together into a single vector 616 along with the one hot trajectory label ci from 612 to produce $V_{enc}(i)$.

This vector is then passed on through a multi-layer perception (MLP) to obtain µ and σ to output a distribution $Q_\phi(z_i|^R X_i, c_i)$.

Formally, $^o h_i^t = LSTM(h_i^{t-1}, ^R X_i^t)$ $V_{enc}(i) = [^o h_i^1, \ldots, ^o h_i^T, c_i]$ $\mu \sigma = MLP(V_{enc}(i))$.

Regarding the conditional generator 640, the exemplary embodiments adapt a U-Net like architecture for the generator. At any timestep t, the inputs 620 to the network conditional generator are the following, a scene context map $\mathcal{I}$ (H×W×3) (622), a single representation of all agents current state $S^t$ (H×W×2) (624), location mask $\mathcal{M}^t$ (H×W×1) (628), a one-hot trajectory specific label (626) for each agent projected at agent specific locations in a grid from $\mathcal{C}^t$ (H×W×3) and a latent vector map $\mathcal{Z}^t$ (H×W×16) (630) including $z_i$ obtained from $Q_\phi(z_i|^R X_i, c_i)$ during a training phase or sampled from prior distribution at test time.

Formally, the network input Et is given by:

$E^t = [\mathcal{I}, S^t, \mathcal{M}^t, \mathcal{C}^t, \mathcal{Z}^t]$, which is of size H×W×25 for any timestep t. Note that the representation is not entity centric. In other words, the exemplary embodiments do not have one target entity for which the exemplary embodiments want to predict trajectories but rather have a global one for all agents.

At each timestep from 1, . . . , $t_{obs}$, the exemplary embodiments pass the above inputs through the encoder module 642. This module 642 includes of strided convolutions, which encode information in small spatial dimensions, and passes them through the decoder 644. The decoder 644 includes ConvLSTMs and transposed convolutions with skip connections from the encoder module 642, and outputs a H×W map. It is then passed on to another ConvLSTM layer 646 with state pooling operations. The same network is shared during an observation and prediction phase. A final 1×1 convolution layer is added to output a 2-channel map 650 including relative predicted coordinates $^R X_i^t$ for the agents in the next timestep.

The exemplary embodiments use the ground truth agent locations for the observed trajectory and unroll the ConvLSTM based on the predictions of the network. During the prediction phase ($t_{obs}, \ldots, T$), the outputs are not directly fed back as inputs to the network rather the agent's state is updated to the next location in the scene based on the predictions. The relative predicted location $^R \hat{X}_i^{t-1}$ gets updated to absolute predicted location $\hat{X}_i^t$ to obtain an updated scene state map $\hat{S}^t$ including updated locations of all the agents in the scene. Note that using such representations for the scene is agnostic to number of agents and as the agents next state is predicted at its respective pixel location it is capable of handling dynamic entry and exit of agents from the scene.

Regarding State-Pooled ConvLSTMs 646, simultaneous multi-agent predictions are realized through state-pooling in ConvLSTMs. Using standard ConvLSTMs for multi-agent trajectory predictions usually produces semantically aligned trajectories, but the trajectories occasionally include erratic maneuvers. The exemplary embodiments solve this issue via state-pooling, which ensures the availability of previous state information when trying to predict the next location. The exemplary embodiments pool the previous state information from the final ConvLSTM layer for all the agents $^{sp}H_i^{t-1}$ and initialize the next state with $^{sp}H_i^{t-1}$ (for both hidden and cell state) at agents updated locations and zero vectors at all other locations for timestep t.

Regarding "learning," the exemplary embodiments train both the recognition network $Q_\phi(z_i|^R X_i, c_i)$ and the conditional generator $P_\Theta(Y|E)$ concurrently. The exemplary embodiments obtain predicted trajectory $^R \hat{Y}$ by pooling values from indexes that agents visited at every timestep.

The exemplary embodiments use two loss functions in training the ConvLSTM network:

The reconstruction loss is given as:

$$\mathcal{L}_R = \frac{1}{N} \sum_i^N \|^R Y_i - ^R \hat{Y}_i\|$$

that penalizes the predictions to enable them to reconstruct the ground truth accurately.

The KL divergence loss is given as: $\mathcal{L}_{KLD} = D_{KL} (Q_\phi(z_i|^R X_i, c_i) \| P_v(z_i|^R X_i, c_i))$ that regularizes the output distribution from Qφ to match the sampling distribution Pv at test time.

In a testing phase, at inference time, the exemplary embodiments do not have access to trajectory specific labels ci but rather query for a specific behavior by sampling these labels randomly. Along with ci for each agent, the exemplary embodiments also sample zi from $P_v(z_i|^R X_i, c_i)$. However, Pv can be relaxed to be independent of the input, thus implying the prior distribution to be $P_v(z_i)$. $P_v(z_i) := \mathcal{N}(0,1)$ at test time.

Figure 2:
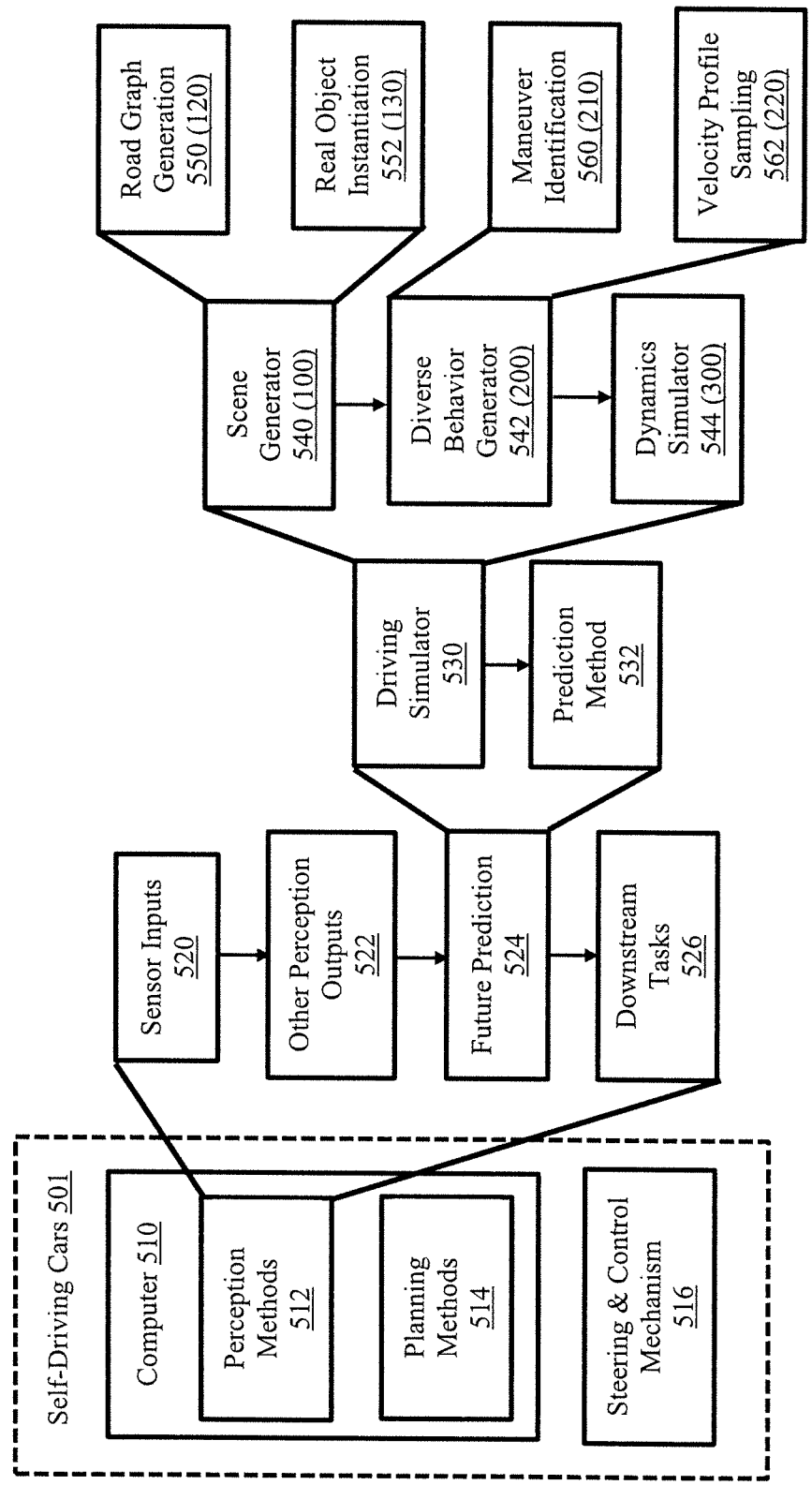
FIG. 2 is a block/flow diagram of an exemplary implementation of simultaneous multi-agent recurrent trajectory prediction, in accordance with embodiments of the present invention.

FIG. 2 is a block/flow diagram of an exemplary implementation of simultaneous multi-agent recurrent trajectory prediction, in accordance with embodiments of the present invention.

A self-driving car 501 can include a computer 510 and a steering and control mechanism 516. The computer 510 can be programmed to execute perception methods 512 and planning methods 514.

The perception methods 512 can include sensor inputs 520, other perception outputs 522, future predictions 524, and downstream tasks 526.

The future predictions 524 can include a driving simulator 530 and a prediction method 532.

The driving simulator 530 can include a scene generator 540 (100), a diverse behavior generator 542 (200), and a dynamics simulator 544 (300).

The scene generator 540 (100) can rely on road graph generation 550 (120) and real object instantiation 552 (130).

The diverse behavior generator 542 (200) can rely on maneuver identification 560 (210) and velocity profile sampling 562 (220).

Figure 3:
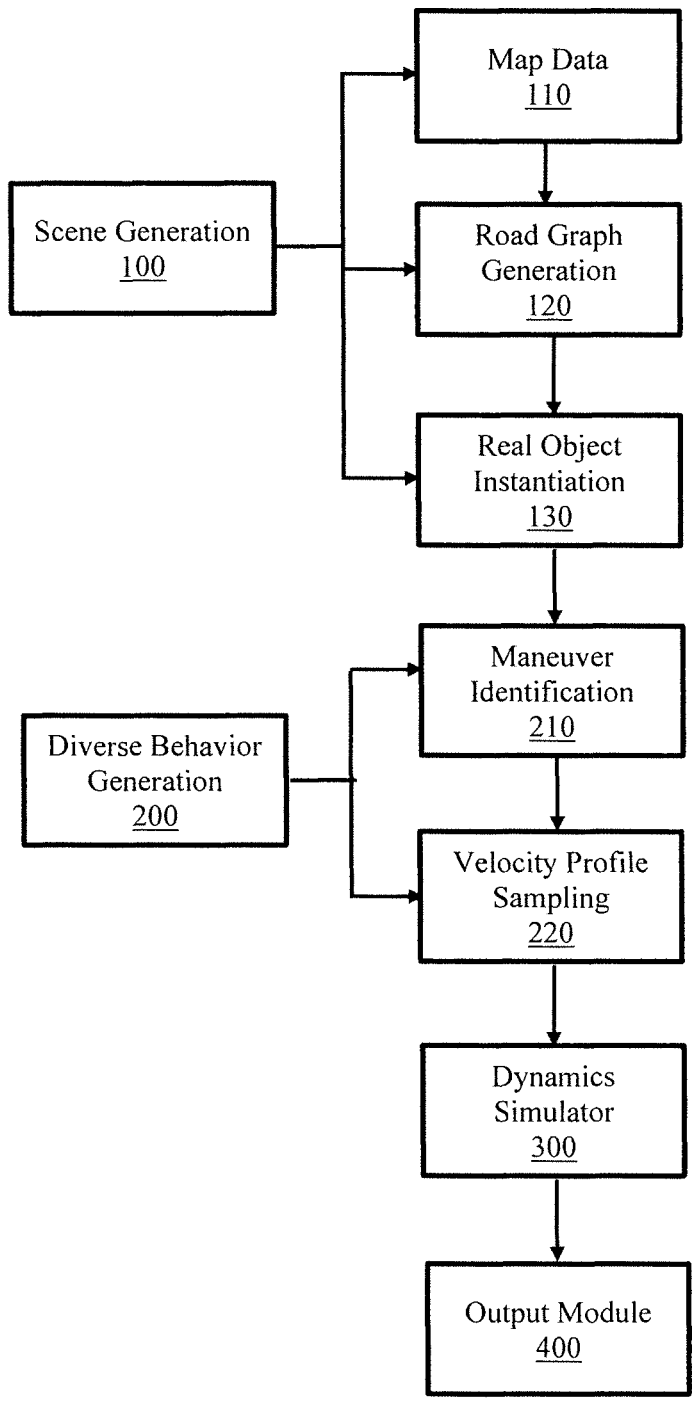
FIG. 3 is a block/flow diagram of an exemplary algorithmic flow of simultaneous multi-agent recurrent trajectory prediction, in accordance with embodiments of the present invention.

FIG. 3 is a block/flow diagram of an exemplary algorithmic flow of simultaneous multi-agent recurrent trajectory prediction, in accordance with embodiments of the present invention.

The first step in the simulation process is to reconstruct the topological layout of the scene (scene generation 100) from real dataset. The exemplary embodiments either use openly available map information 110 or use the available high-definition HD map information in the dataset to create a road graph of the scene. Road graph captures hierarchical structures of the lanes interconnected with each other (road graph generation 120). Then the exemplary embodiments place or introduce vehicles from the real scene on the generated road graph and assign vehicles to their closest lane ids (real object instantiation 130).

The exemplary embodiments then move to diverse behavior generation where the exemplary embodiments sample a behavior along with an associated velocity profile from the real-world data (diverse behavior generation 200). Specifically, diverse behavior generation 200 includes maneuver identification 210 and velocity profile sampling 220. Maneuver identification 210 identifies plausible maneuvers for every vehicle in the scene while the velocity profile sampling 220 samples an appropriate velocity from the real-world data. Road graph from 100 and sampled velocity profile 220 along with desired destination from 210 and is given as input to the dynamics simulator 300 to generate a safe trajectory 400 for all the vehicles in the scene.

Figure 5:
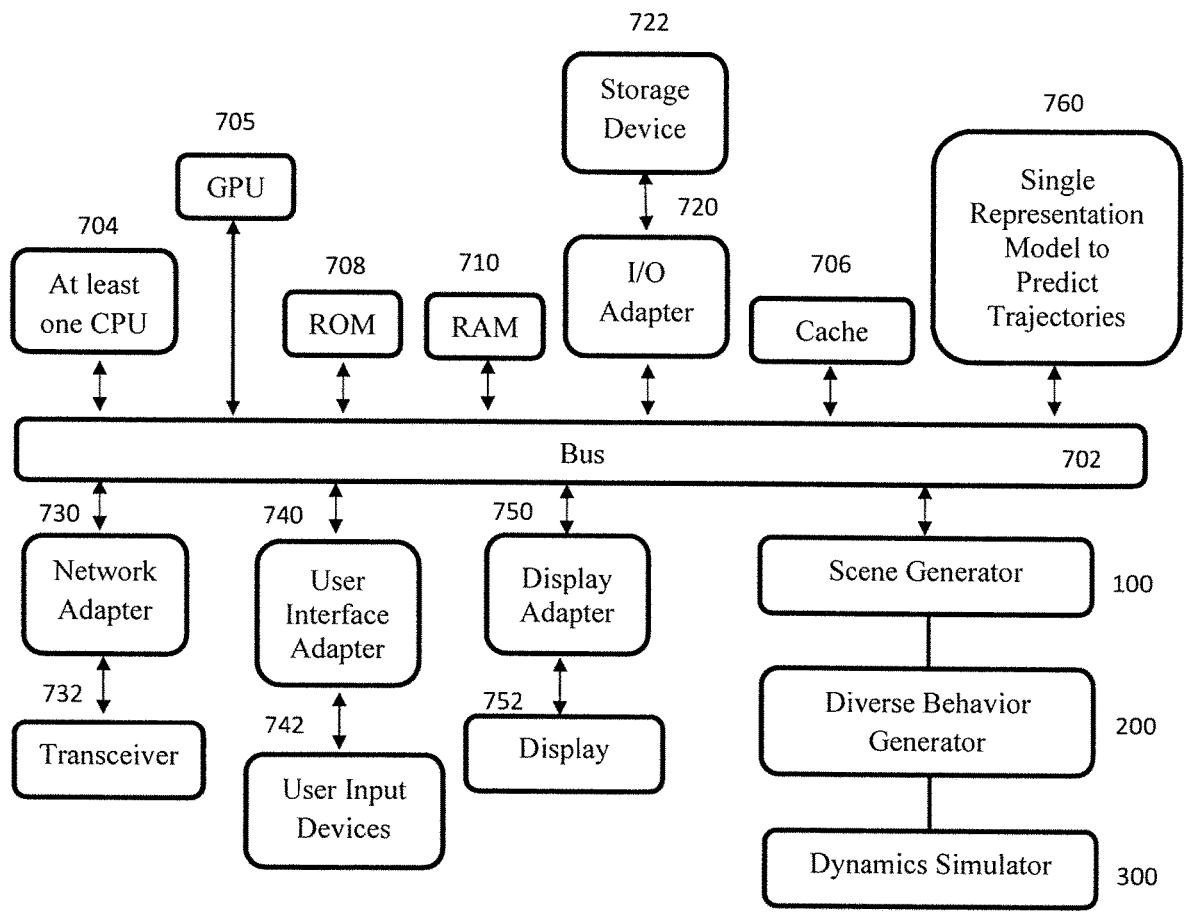
FIG. 5 is a block/flow diagram of an exemplary processing system for simultaneous multi-agent recurrent trajectory prediction, in accordance with embodiments of the present invention.

FIG. 5 is block/flow diagram of an exemplary processing system for simultaneous multi-agent recurrent trajectory prediction, in accordance with embodiments of the present invention.

The processing system includes at least one processor or processor device (CPU) 704 and a graphics processing unit (GPU) 705 operatively coupled to other components via a system bus 702. A cache 706, a Read Only Memory (ROM) 708, a Random Access Memory (RAM) 710, an input/output (I/O) adapter 720, a network adapter 730, a user interface adapter 740, and a display adapter 750, are operatively coupled to the system bus 702. A single representation model to predict trajectories 760 can be employed via the bus 702. The single representation model to predict trajectories 760 can employ a scene generator 100, a diverse behavior generator 200, and a dynamics simulator 300.

A storage device 722 is operatively coupled to system bus 702 by the I/O adapter 720. The storage device 722 can be any of a disk storage device (e.g., a magnetic or optical disk storage device), a solid state magnetic device, and so forth.

A transceiver 732 is operatively coupled to system bus 702 by network adapter 730.

User input devices 742 are operatively coupled to system bus 702 by user interface adapter 740. The user input devices 742 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 742 can be the same type of user input device or different types of user input devices. The user input devices 742 are used to input and output information to and from the processing system.

A display device 752 is operatively coupled to system bus 702 by display adapter 650.

Of course, the processing system may also include other elements (not shown), as readily contemplated by one of skill in the art, as well as omit certain elements. For example, various other input devices and/or output devices can be included in the system, depending upon the particular implementation of the same, as readily understood by one of ordinary skill in the art. For example, various types of wireless and/or wired input and/or output devices can be used. Moreover, additional processors, processor devices, controllers, memories, and so forth, in various configurations can also be utilized as readily appreciated by one of ordinary skill in the art. These and other variations of the processing system are readily contemplated by one of ordinary skill in the art given the teachings of the present invention provided herein.

Figure 6:
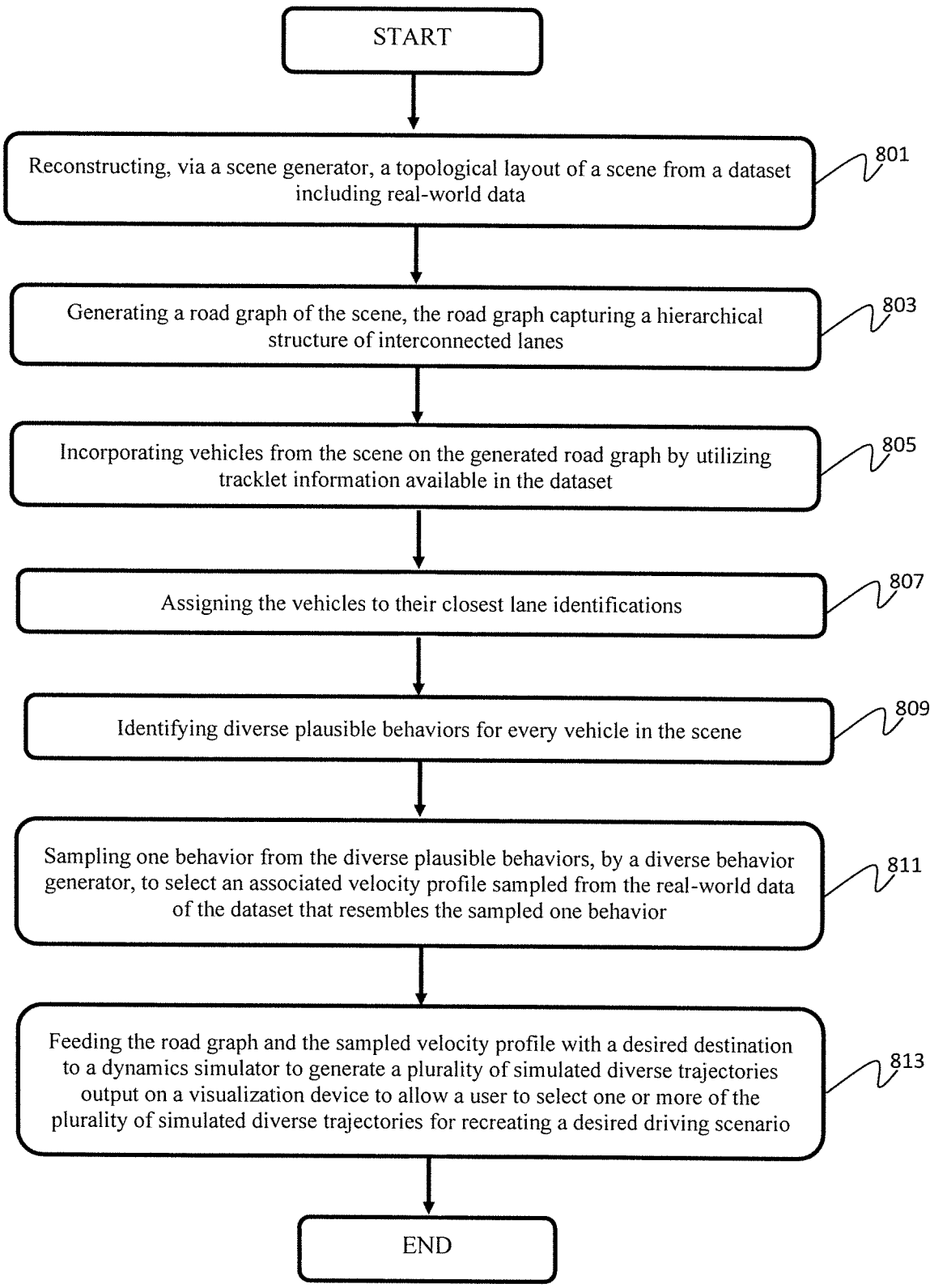
FIG. 6 is a block/flow diagram of an exemplary method for simultaneous multi-agent recurrent trajectory prediction, in accordance with embodiments of the present invention.

FIG. 6 is a block/flow diagram of an exemplary method for simultaneous multi-agent recurrent trajectory prediction, in accordance with embodiments of the present invention.

At block 801, reconstruct, via a scene generator, a topological layout of a scene from a dataset including real-world data.

At block 803, generate a road graph of the scene, the road graph capturing a hierarchical structure of interconnected lanes.

At block 805, incorporate vehicles from the scene on the generated road graph by utilizing tracklet information available in the dataset.

At block 807, assign the vehicles to their closest lane identifications.

At block 809, identify diverse plausible behaviors for every vehicle in the scene.

At block 811, sample one behavior from the diverse plausible behaviors, by a diverse behavior generator, to select an associated velocity profile sampled from the real-world data of the dataset that resembles the sampled one behavior.

At block 813, feed the road graph and the sampled velocity profile with a desired destination to a dynamics simulator to generate a plurality of simulated diverse trajectories output on a visualization device to allow a user to select one or more of the plurality of simulated diverse trajectories for recreating a desired driving scenario.

Figure 7:
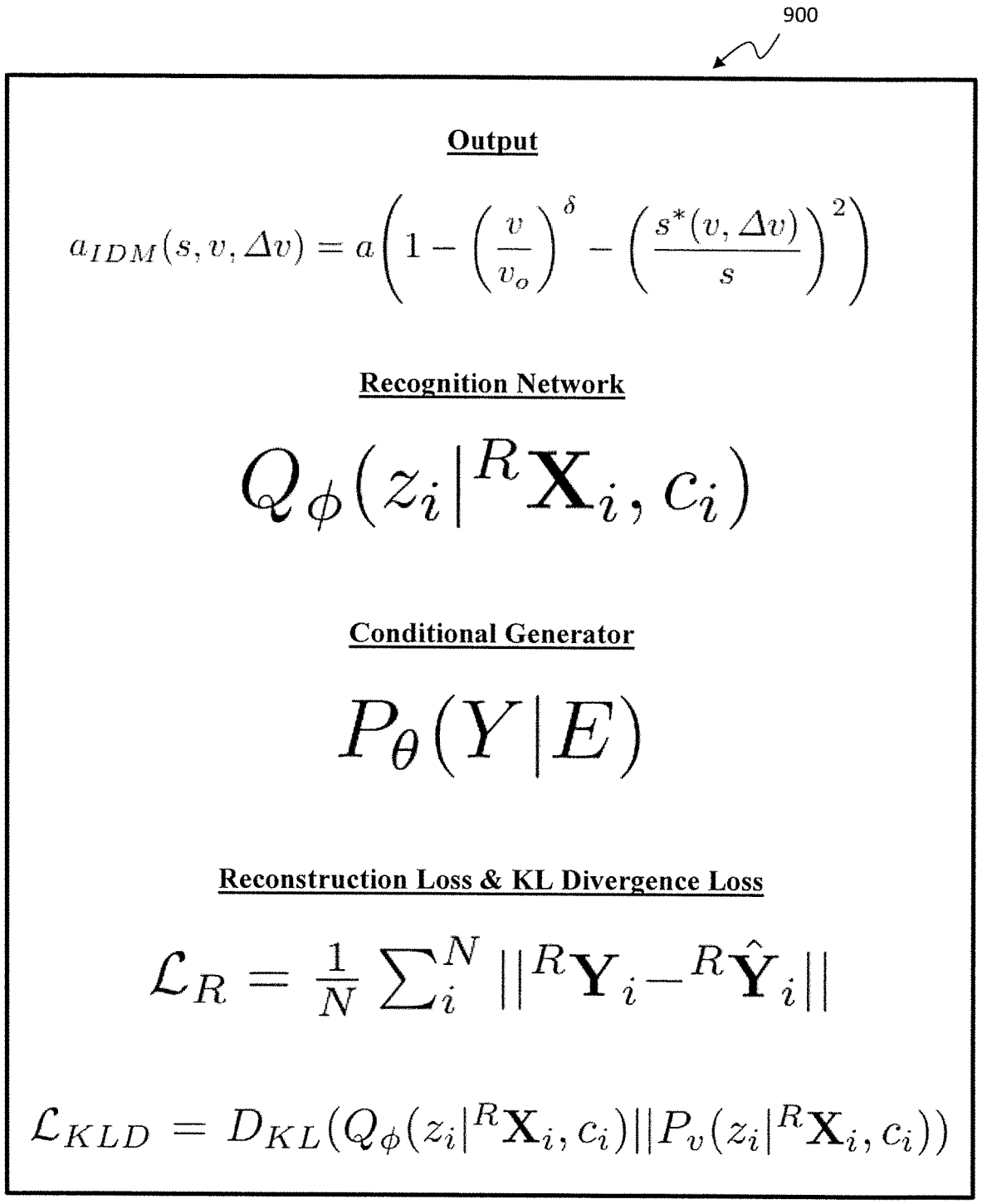
FIG. 7 is a block/flow diagram of equations employed in an exemplary method for simultaneous multi-agent recurrent trajectory prediction, in accordance with embodiments of the present invention.

FIG. 7 is a block/flow diagram of equations employed in methods for simultaneous multi-agent recurrent trajectory prediction, in accordance with embodiments of the present invention.

Equations 900 identify the output for a safe trajectory, a recognition network, a conditional generator, and losses, such as reconstruction losses and KL divergence losses.

Figure 8:
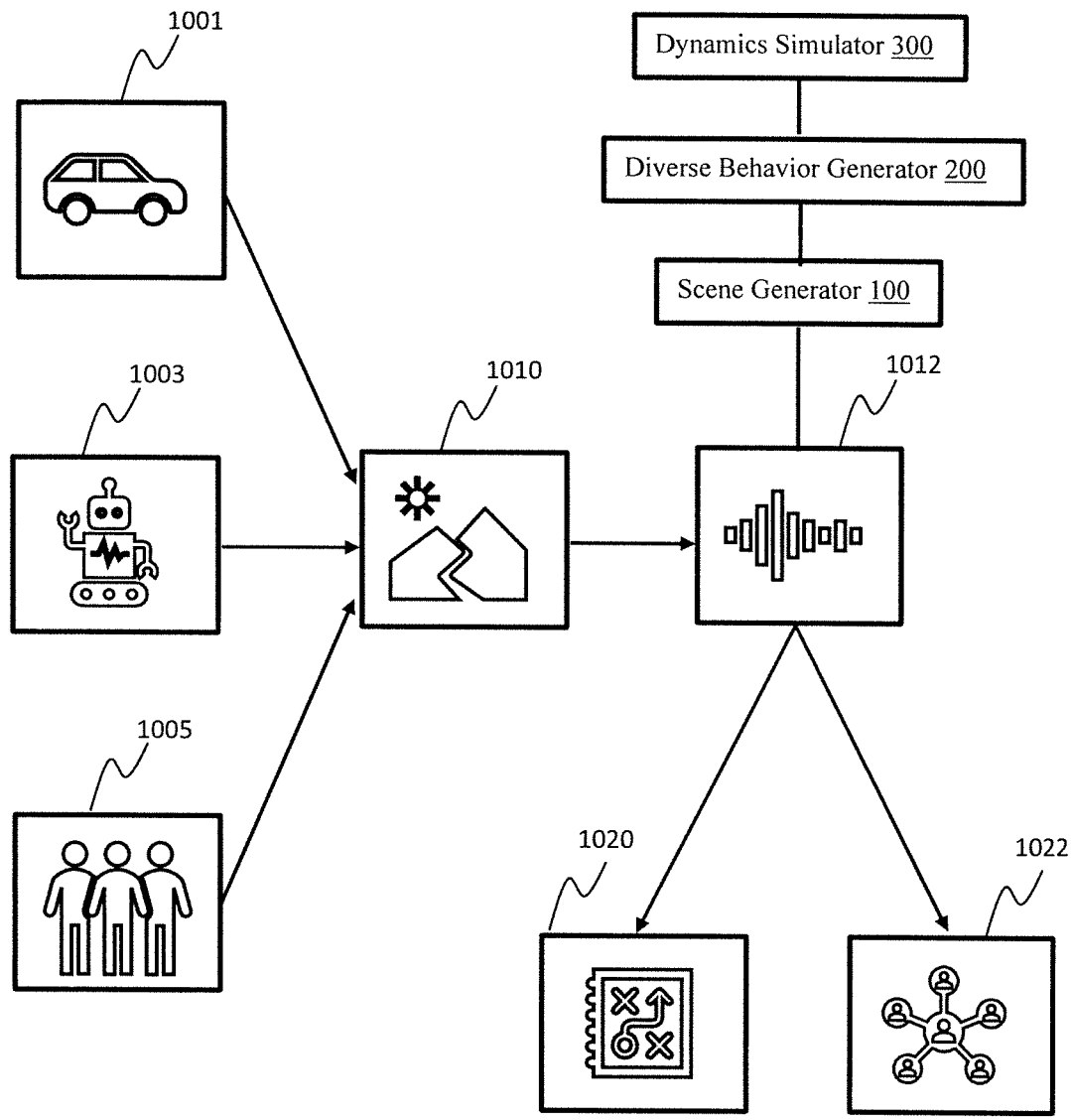
FIG. 8 is a block/flow diagram of a practical application for simultaneous multi-agent recurrent trajectory prediction, in accordance with embodiments of the present invention.

FIG. 8 is a block/flow diagram of a practical application for simultaneous multi-agent recurrent trajectory prediction, in accordance with embodiments of the present invention.

Advanced Driver Assistance Systems (ADAS) 1001, robots 1003, and agents 1005 can be employed in a scene 1010. Such applications 1001, 1003, 1005 may need knowledge of how other vehicles/robots/agents move in the scene 1010. A simulation process 1012 takes place to simulate diverse behaviors for the vehicles/robots/agents 1001, 1003, 1005 such that a safety plan or safe action 1020 is rendered. Alternatively, diverse training examples 1022 can be generated for training models employed in the ADAS or robots or other applications. The simulation process 1012 can use the scene generator 100, the diverse behavior generator 200, and the dynamics simulator 300.

In conclusion, the exemplary embodiments address the issue of generating behaviors with multiple driver intents for real-world scenarios. To achieve this, the exemplary embodiments propose a new simulation strategy on top-view representations of scenes that abstracts several low-level domain specific gaps that occur when generating trajectories in sensor space and improve the generalizability of trajectories across multiple domains. In particular, the exemplary embodiments leverage, e.g., open source map information to recreate scenes from real-world data and execute multi-intent behaviors for simulated vehicles. The simulation method incorporates realistic trajectories by sampling similar velocity profiles from real-world data. The exemplary embodiments have a dynamics simulation engine based on an Intelligent Driver Model (IDM) that provides safe accelerations for current traffic conditions. The exemplary embodiments also incorporate lane changing decisions for simulated vehicles that check for safety while performing such maneuvers.

As used herein, the terms "data," "content," "information" and similar terms can be used interchangeably to refer to data capable of being captured, transmitted, received, displayed and/or stored in accordance with various example embodiments. Thus, use of any such terms should not be taken to limit the spirit and scope of the disclosure. Further, where a computing device is described herein to receive data from another computing device, the data can be received directly from the another computing device or can be received indirectly via one or more intermediary computing devices, such as, for example, one or more servers, relays, routers, network access points, base stations, and/or the like. Similarly, where a computing device is described herein to send data to another computing device, the data can be sent directly to the another computing device or can be sent indirectly via one or more intermediary computing devices, such as, for example, one or more servers, relays, routers, network access points, base stations, and/or the like.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," "calculator," "device," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical data storage device, a magnetic data storage device, or any suitable combination of the foregoing. In the context of this document, a computer readable storage medium may be any tangible medium that can include, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks or modules.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks or modules.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method executed on a processor for simultaneous multi-agent recurrent trajectory prediction, the method comprising:
   reconstructing, via a scene generator, a topological layout of a scene from a dataset including real-world data;
   generating a road graph of the scene, the road graph capturing a hierarchical structure of interconnected lanes;
   incorporating vehicles from the scene on the generated road graph by utilizing tracklet information available in the dataset;
   assigning the vehicles to their closest lane identifications;
   identifying diverse plausible behaviors for every vehicle in the scene;
   sampling one behavior from the diverse plausible behaviors, by a diverse behavior generator, for every vehicle in the scene;
   sampling a velocity profile using the sampled behavior, by the diverse behavior generator, to identify a closest behavior from real scenes using heuristics with nearest neighbor sampling for every vehicle in the scene;
   obtaining realistic trajectory characteristics for every vehicle in the scene, by the diverse behavior generator, by associating the sampled velocity profile with a plurality of real-world trajectory samples that are classified into different maneuver categories using a set of centerlines from the road graph;
   generating a plurality of simulated diverse trajectories using a dynamics simulator by utilizing the road graph, the sampled velocity profile, and the realistic trajectory characteristics with a desired destination; and
   outputting on a visualization device to allow a user to select one or more of the plurality of simulated diverse trajectories for recreating a desired driving scenario.

2. The method of claim 1, wherein the diverse behavior generator includes maneuver identification and velocity profile sampling.

3. The method of claim 2, wherein the maneuver identification identifies different plausible maneuvers for every vehicle in the scene and samples one maneuver for every vehicle, and the velocity profile sampling samples an appropriate velocity from the real-world data.

4. The method of claim 1, wherein the road graph is a Birds-Eye-View reconstruction or top-view representation of the scene.

5. The method of claim 1, wherein a velocity profile is sampled according to the sampled one behavior based on heuristics including distance to intersection and average velocity.

6. The method of claim 1, wherein the dynamics simulator generates a safe trajectory for every vehicle in the scene.

7. The method of claim 6, wherein the safe trajectory is given by:

$$a_{IDM}(s, v, \Delta v) = a\left(1 - \left(\frac{v}{v_o}\right)^\delta - \left(\frac{s^*(v, \Delta v)}{s}\right)^2\right)$$

where a is a comfortable acceleration, vo is a desired reference velocity, v is an actual velocity of a vehicle, δ is an exponent that influences how acceleration decreases with velocity, s is an actual bumper distance, s* is a desired minimum gap, and Δv is a velocity difference with a leading vehicle.

8. The method of claim 1, further comprising a latent encoder and a conditional generator, the latent encoder acting as a recognition module and used during a training phase.

9. The method of claim 8, wherein the conditional generator includes a convolutional encoder and a Convolutional Long Short-Term Memory (ConvLSTM) decoder.

10. A non-transitory computer-readable storage medium comprising a computer-readable program for simultaneous multi-agent recurrent trajectory prediction, wherein the computer-readable program when executed on a computer causes the computer to perform the steps of:
reconstructing, via a scene generator, a topological layout of a scene from a dataset including real-world data;
generating a road graph of the scene, the road graph capturing a hierarchical structure of interconnected lanes;
incorporating vehicles from the scene on the generated road graph by utilizing tracklet information available in the dataset;
assigning the vehicles to their closest lane identifications;
identifying diverse plausible behaviors for every vehicle in the scene;
sampling one behavior from the diverse plausible behaviors, by a diverse behavior generator, for every vehicle in the scene;
sampling a velocity profile using the sampled behavior, by the diverse behavior generator, to identify a closest behavior from real scenes using heuristics with nearest neighbor sampling for every vehicle in the scene;
obtaining realistic trajectory characteristics for every vehicle in the scene, by the diverse behavior generator, by associating the sampled velocity profile with a plurality of real-world trajectory samples that are classified into different maneuver categories using a set of centerlines from the road graph;
generating a plurality of simulated diverse trajectories using a dynamics simulator by utilizing the road graph, the sampled velocity profile, and the realistic trajectory characteristics with a desired destination; and
outputting on a visualization device to allow a user to select one or more of the plurality of simulated diverse trajectories for recreating a desired driving scenario.

11. The non-transitory computer-readable storage medium of claim 10, wherein the diverse behavior generator includes maneuver identification and velocity profile sampling.

12. The non-transitory computer-readable storage medium of claim 11, wherein the maneuver identification identifies different plausible maneuvers for every vehicle in the scene and samples one maneuver for every vehicle, and the velocity profile sampling samples an appropriate velocity from the real-world data.

13. The non-transitory computer-readable storage medium of claim 10, wherein the road graph is a Birds-Eye-View reconstruction or top-view representation of the scene.

14. The non-transitory computer-readable storage medium of claim 10, wherein a velocity profile is sampled according to the sampled one behavior based on heuristics including distance to intersection and average velocity.

15. The non-transitory computer-readable storage medium of claim 10, wherein the dynamics simulator generates a safe trajectory for every vehicle in the scene.

16. The non-transitory computer-readable storage medium of claim 15, wherein the safe trajectory is given by:

$$a_{IDM}(s, v, \Delta v) = a\left(1 - \left(\frac{v}{v_o}\right)^\delta - \left(\frac{s^*(v, \Delta v)}{s}\right)^2\right)$$

where a is a comfortable acceleration, vo is a desired reference velocity, v is an actual velocity of a vehicle, δ is an exponent that influences how acceleration decreases with velocity, s is an actual bumper distance, s* is a desired minimum gap, and Δv is a velocity difference with a leading vehicle.

17. The non-transitory computer-readable storage medium of claim 10, further comprising a latent encoder and a conditional generator, the latent encoder acting as a recognition module and used during a training phase.

18. The non-transitory computer-readable storage medium of claim 17, wherein the conditional generator includes a convolutional encoder and a Convolutional Long Short-Term Memory (ConvLSTM) decoder.

19. A system for simultaneous multi-agent recurrent trajectory prediction, the system comprising:
a memory; and
one or more processors in communication with the memory configured to:
reconstruct, via a scene generator, a topological layout of a scene from a dataset including real-world data;
generate a road graph of the scene, the road graph capturing a hierarchical structure of interconnected lanes;
incorporate vehicles from the scene on the generated road graph by utilizing tracklet information available in the dataset;
assign the vehicles to their closest lane identifications;
identify diverse plausible behaviors for every vehicle in the scene;
sample one behavior from the diverse plausible behaviors, by a diverse behavior generator, for every vehicle in the scene;
sample a velocity profile using the sampled behavior, by the diverse behavior generator, to identify a closest behavior from real scenes using heuristics with nearest neighbor sampling for every vehicle in the scene;
obtain realistic trajectory characteristics for every vehicle in the scene, by the diverse behavior generator, by associating the sampled velocity profile with a plurality of real-world trajectory samples that are classified into different maneuver categories using a set of centerlines from the road graph;
generate a plurality of simulated diverse trajectories using a dynamics simulator by utilizing the road graph, the sampled velocity profile, and the realistic trajectory characteristics with a desired destination; and
output on a visualization device to allow a user to select one or more of the plurality of simulated diverse trajectories for recreating a desired driving scenario.

20. The system of claim 19,
wherein the diverse behavior generator includes maneuver identification and velocity profile sampling; and
wherein the maneuver identification identifies different plausible maneuvers for every vehicle in the scene and samples one maneuver for every vehicle, and the velocity profile sampling samples an appropriate velocity from the real-world data.

* * * * *